US010079189B2

(12) United States Patent
Carter et al.

(10) Patent No.: US 10,079,189 B2
(45) Date of Patent: Sep. 18, 2018

(54) P-TYPE TRANSPARENT CONDUCTING NICKEL OXIDE ALLOYS

(71) Applicant: The Trustees of Princeton University, Princeton, NJ (US)

(72) Inventors: Emily Ann Carter, Belle Mead, NJ (US); Nima Alidoust, New York, NY (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 15/617,339

(22) Filed: Jun. 8, 2017

(65) Prior Publication Data

US 2017/0355615 A1    Dec. 14, 2017

Related U.S. Application Data

(60) Provisional application No. 62/347,157, filed on Jun. 8, 2016.

(51) Int. Cl.
*H01L 23/29*    (2006.01)
*H01L 21/02*    (2006.01)
(Continued)

(52) U.S. Cl.
CPC ............ *H01L 23/298* (2013.01); *C01G 53/00* (2013.01); *H01L 21/02576* (2013.01); *H01L 21/02579* (2013.01); *H01L 23/53209* (2013.01)

(58) Field of Classification Search
CPC ............ H01L 23/298; H01L 21/02579; H01L 23/02576; C01G 53/00
See application file for complete search history.

(56) References Cited

U.S. PATENT DOCUMENTS

| 2008/0025681 A1* | 1/2008 | Shtein ................ H01L 51/4206 385/128 |
| 2013/0118567 A1* | 5/2013 | Kim ...................... H01L 27/302 136/255 |
| 2017/0316887 A1* | 11/2017 | Maruyama ........... H01G 9/2027 |

OTHER PUBLICATIONS

Zhao et al. "MgNiO-based . . . ultraviolet photodetector", Apr. 2009.*

(Continued)

*Primary Examiner* — Long Pham
(74) *Attorney, Agent, or Firm* — Meagher Emanuel Laks Goldberg & Liao, LLP

(57) ABSTRACT

Disclosed herein is the formation of p-type transparent conducting oxides (TCO) having a structure of $Mg_xNi_{1-x}O$ or $Zn_xNi_{1-x}O$. These structures disrupt the two-dimensional confinement of individual holes (the dominant charge carrier transport mechanism in pure NiO) creating three-dimensional hole transport by providing pathways for hole transfer in directions that are unfavorable in pure NiO. Forming these structures preserves NiO's transparency to visible light since the band gaps do not deviate significantly from that of pure NiO. Furthermore, forming $Mg_xNi_{1-x}O$ or $Zn_xNi_{1-x}O$ does not lead to hole trapping on O ions adjacent to Zn and Mg ions. The formation of these alloys will lead to creation of three-dimensional hole transport and improve NiO's conductivity for use as p-type TCO, without adversely affecting the favorable properties of pure NiO.

16 Claims, 7 Drawing Sheets

(51) Int. Cl.
*H01L 23/532* (2006.01)
*C01G 53/00* (2006.01)

(56) References Cited

OTHER PUBLICATIONS

Kwon et al. "Semiconducting p-type MgNiO . . . method", 2013.*
Blöchl, P. E. "Projector augmented-wave method" Phys. Rev. B, 50, 17953-17979, 1994.
Kohn, W.; Sham, L. J. "Self-Consistent Equations Including Exchange and Correlation Effects" Phys. Rev., 140, A1133-A1138, 1965.
Bengone, O.; Alouani, M.; Blöchl, P.; Hugel, J. "Implementation of the projector augmented-wave LDA+ U method: Application to the electronic structure of NiO" Phys. Rev. B, 62, 16392-16401, 2000.
Dudarev, S. L.; Botton, G. A ; Savrasov, S. Y.; Humphreys, C. J.; Sutton, A P. "Electron-energy-loss spectra and the structural stability of nickel oxide: An LSDA+U study" Phys. Rev. B, 57, 1505-1509, 1998.
Jepson, O.; Anderson, O. K. "The Electronic Structure of h.c.p. Ytterbium" Solid State Commun., 9, 1763-1767, 1971.
Blöchl, P. E.; Jepsen, O.; Andersen, O. K. "Improved tetrahedron method for Brillouin-zane integrations" Phys. Rev. B, 49, 16223-16233, 1994.
Kanan, D. K. ; Sharifzadeh, S.; Carter, E. A "Quantum mechanical modeling of electronic excitations in metal oxides: Magnesia as a prototype" Chem. Phys. Lett., 519-520, 18-24, 2012.
Liao, P.; CasparyToroker, M.; Carter, E. A "Electron Transport in Pure and Doped Hematite" NanoLett., 11, 1775-81, 2011.
Fiévet, F.; Germi, P.; de Bergevin, F.; Figlarz, M. "Lattice Parameter, Microstrains and Non-Stoichiometry in NiO. Comparison between Mosaic Microcrystals and Quasi-Perfect Single Microcrystals" J. Appl. Crystallogr. , 12, 387-394,1979.
Wadt, W. R. ; Hay, P. J. "Ab Initio effective core potentials for molecular calculations. Potentials for main group elements Na to Bi" J. Chem. Phys., 82, 284-298, 1985.
Shannon, R. D.; Prewitt, C. T. "Effective Ionic Radii in Oxides and Fluorides" Acta Crystallogr. Sect. B, 25, 925-946, 1969.
Hehre, W. J.; Ditchfield, R. ; Pople, J. A "Self-Consistent Molecular Orbital Methods. XII. Further Extensions of Gaussian-Type Basis Sets for Use in Molecular Orbital Studies of Organic Molecules" J. Chem. Phys., 56, 2257-2261, 1972.
Hay, P. J.; Wadt, W. R. "Ab initio effective core potentials for molecular calculations. Potentials for K to Au including the outermost core orbitals" J. Chem. Phys., 82, 299-310, 1985.
Francl, M. M. "Self-consistent molecular orbital methods. XXIII. A polarization-type basis set for second-row elements" J. Chem. Phys., 77, 3654, 1982.
Alidoust N.; Carter E. A. "Three-dimensional hole transport in nickel oxide by alloying with MgO or ZnO" Journal of applied Physics, 118, 185102, 2015.
Crabtree, G. W.; Lewis, N. S. "Solar energy conversion" Phys. Today, 60, 37-42, 2007.
Walter, M. G.; Warren, E. L.; McKone, J. R.; Boettcher, S. W.; Mi, Q.; Santori, E. A; Lewis, N. S. : "Solar Water Splitting Cells" Chem. Rev., 110, 6446-6473, 2010.
Grätzel, M. "Solar Energy Conversion by Dye-Sensitized Photovoltaic Cells" Inorg. Chem., 44, 6841-6851, 2005.
Grätzel, M. "Dye-sensitized solar cells", J. Photochem. Photobiol. C Photochem. Rev., 4, 145-153, 2003.
Powar, S. ; Wu, Q.; Weidelener, M.; Nattestad, A ; Hu, Z. ; Mishra, A ; Bäuerle, P. ; Spiccia, L.; Cheng, Y.-B.; Bach, U. "Improved photocurrents for p-type dye-sensitized solar cells using nanostructured nickel(II) oxide microballs" Energy Environ. Sci., 5, 8896-8900, 2012.
Nattestad, A ; Ferguson, M.; Kerr, R. ; Cheng, Y.-B.; Bach, U. "Dye-sensitized nickel(II)oxide photocathodes for tandem solar cell applications" Nanotechnology, 19, 295304, 2008.

Mori, S. ; Fukuda, S.; Sumikura, S.; Takeda, Y.; Tamaki, Y.; Suzuki, E.; Abe, T. "Charge-Transfer Processes in Dye-Sensitized NiO Solar Cells" J. Phys. Chern. C, 112, 16134-16139, 2008.
Liao, P.; Carter, E. A "New concepts and modeling strategies to design and evaluate photo-electro-catalysts based on transition metal oxides" Chern. Soc. Rev., 42, 2401-2422, 2013.
Ellmer, K. "Past achievements and future challenges in the development of optically transparent electrodes" Nat. Photonics, 6, 808-816, 2012.
Anta, J. A ; Guillen, E.; Tena-Zaera, R. "ZnO-Based Dye-Sensitized Solar Cells" J. Phys. Chem. C, 116, 11413-11425, 2012.
Hautier, G.; Miglio, A ; Ceder, G.; Rignanese, G.-M.; Gonze, X. "Identification and design principles of low hole effective mass p-type transparent conducting oxides" Nat. Commun., 4, 2292, 2013.
Alidoust, N.; Caspary Toroker, M.; Carter, E. A "Revisiting Photoemission and Inverse Photoemission Spectra of Nickel Oxide from First Principles: Implications for Solar Energy Conversion" J. Phys. Chem. 8, 118, 7963-71, 2014.
Hüfner, S. "Electronic structure of NiO and related 3dtransition-metal compounds" Adv. Phys., 43, 183-356, 1994.
Alidoust, N.; Toroker, M. C. ; Keith, J. A ; Carter, E. A "Significant Reduction in NiO Band Gap Upon Formation of $Li_xNi_{1-x}O$ alloys: Applications to Solar Energy Conversion" ChemSusChem, 7, 195-201, 2014.
Irwin, M. D.; Buchholz, D. B.; Hains. A W.; Chang, R. P. H.; Marks, T. "p-Type semiconducting nickel oxide as an efficiency-enhancing anode interfacial layer in polymer bulk-heterojunction solar cells" J. Proc. Natl. Acad. Sci., 105, 2783-2787, 2008.
Morandeira, A ; Boschloo, G.; Hagfeldt, A ; Hammarstrom, L. "Photoinduced Ultrafast Dynamics of Coumarin 343 Sensitized p-Type-Nanostructured NiO Films" J. Phys. Chem. 8, 109, 19403-19410, 2005.
Morandeira, A ; Fortage, J.; Edvinsson, T.; LePieux, L.; Blart, E.; Boschloo, G.; Hagfeldt, A; Hammarstrom, L.; Odobel, F. "Improved Photon-to-Current Conversion Efficiency with a Nanoporous p-Type NiO Electrode by the Use of a Sensitizer-Acceptor Dyad" J. Phys. Chem. C, 112, 1721-1728, 2008.
Sun, K. ; Saadi, F. H.; Lichterman, M. F.; Hale, W. G.; Wang, H.-P.; Zhou, X.; Plymale, N. T. ; Omelchenko, S. T. ; He, J.-H.; Papadantonakis, K. M.; Brunschwig, B. S. ; Lewis, N. S. "Stable solar-driven oxidation of water by semiconducting photoanodes protected by transparent catalytic nickel oxide films" Proc. Natl. Acad. Sci., 201423034, 2015.
Xu, X. ; Liu, Z.; Zuo, Z.; Zhang, M.; Zhao, Z.; Shen, Y.; Zhou, H.; Chen, Q.; Yang, Y.; Wang, M. "Hole Selective NiO contact for Efficient Perovskite Solar Cells with Carbon Electrode" Nano Lett., 150327090836008, 2015.
Ismail, R. A ; Ghafori, S. ; Kadhim, G. A "Preparation and characterization of nanostructured nickel oxide thin films by spray pyrolysis" Appl. Nanosci., 3, 509-514, 2013.
Guo, W.; Hui, K. N.; Hui, K. S. "High conductivity nickel oxide thin films by a facile sol-gel method" Mater. Lett., 92, 291-295, 2013.
Dutta, T.; Gupta, P.; Gupta, A ; Narayan, J. "Effect of Li doping in NiO thin films on its transparent and conducting properties and its application in heteroepitaxial p-n junctions" J. Appl. Phys., 108, 083715, 2010.
Kolber, M.; MacCrone, R. "Bound-polaron Hopping in NiO" Phys. Rev. Lett., 29, 1457-1461, 1972.
Liao, P.; Carter, E. A "Hole transport in pure and doped hematite" J. Appl. Phys., 112, 013701, 2012.
Toroker, M. C.; Carter, E. A "Hole Transport in Nonstoichiometric and Doped Wüstite" J. Phys. Chem. C, 116, 17403-17413, 2012.
Kanan, D. K. ; Carter, E. A "Ab initio study of electron and hole transport in pure and doped MnO and MnO:ZnO alloy" J. Mater. Chem. A, 1, 9246, 2013.
Iordanova, N.; Dupuis, M.; Rosso, K. M. "Charge transport in metal oxides: A theoretical study of hematite a-Fe2O3" J. Chem. Phys., 122, 144305, 2005.
Marcus, R. A "On the Theory of Oxidation-Reduction Reactions Involving Electron Transfer. I" J. Chem. Phys., 24, 966, 1956.
Marcus, R. "Electron transfer reactions in chemistry. Theory and experiment" Rev. Mod. Phys., 65, 599-610, 1993.

(56) References Cited

OTHER PUBLICATIONS

Alidoust, N.; Carter, E. A "First-principles assessment of hole transport in pure and Li-doped NiO" Phys. Chem. Chem. Phys., 17, 18098-18110, 2015.

Handley, S. J.; Bradberry, G. W. "Estimates of Charge Carrier Mobility and Lifetime in Nickel Oxide" Phys. Lett. A, 40, 277-278, 1972.

Guziewicz, M. A; Grochowski, J. A; Borysiewicz, M. 1.; Kaminska, E. L. "Electrical and optical properties of NiO films deposited by magnetron sputtering" Opt. Appl., XLI, 1-10, 2011.

Hedin, L. "New Method for Calculating the One-Particle Green's Function with Application to the Electron-Gas Problem" Phys. Rev., 139, A796-A823, 1965.

Caspary Toroker, M.; Kanan, D. K.; Alidoust, N.; Isseroff, L. Y.; Liao, P.; Carter, E. A "First principles scheme to evaluate band edge positions in potential transition metal oxide photocatalysts and photoelectrodes" Phys. Chem. Chem. Phys., 13, 16644-16654, 2011.

Kresse, G.; Furthmüller, J. "Efficiency of ab-initio total energy calculations for metals and semiconductors using a plane-wave basis set" Comput. Mater. Sci., 6, 15-50, 1996 (Abstract submitted).

Kresse, G.; Hafner, J. "Ab initio molecular dynamics for liquid metals" Phys. Rev. 8, 47, 558-561, 1993.

Anisimov, V. I.; Zaanen, J.; Anderson, O. K. "Band theory and Mott insulators: Hubbard U instead of Stoner I" Phys. Rev. 8, 44, 943-954, 1991.

Anisimov, V. I.; Solovyev, I. V.; Korotin, M. A; Czyzyk, M. T.; Sawatzky, G. A. "Density-functional theory and Nio photoemission spectra" Phys. Rev. B, 48, 16929-16934, 1993.

Perdew, J. P.; Burke, K.; Ernzerhof, M. "Generalized Gradient Approximation Made Simple" Phys. Rev. Lett., 77, 3865-3868, 1996.

Toroker, M. C.; Carter, E. A "Transition metal oxide alloys as potential solar energy conversion materials" J. Mater. Chem. A, 1, 2474, 2013.

Zunger, A; Wei, S.-H.; Ferreira, L. G.; Bernard, J. E. "Special Quasirandom Structures" Phys. Rev. Lett., 65, 353-356, 1990.

Wei, S.-H.; Ferreira, L. G.; Bernard, J. E.; Zunger, A "Electronic properties of random alloys: Special quasirandom structures" Phys. Rev. B, 42, 9622-9649, 1990.

Schmidt, M. W.; Baldridge, K. K.; Boatz, J. A; Elbert, S. T.; Gordon, M. S.; Jensen, J. H.; Koseki, S.; Matsunaga, N.; Nguyen, K. A; Su, S.; Windus, T. L.; Dupuis, M.; Montgomery, J. A "General Atomic and Molecular Electronic Structure System" J. Comput. Chem., 14, 1347-1363, 1993.

Gordon, M. S.; Schmidt, M. W. "Chapter 41—Advances in electronic structure theory: GAMESS a decade later" In Theory and Applications of Computational Chemistry: The First Forty Years; Dykstra, C. E.; Frenking, G.; Kim, K. S.; Scuseria, G. E., Eds.; Elsevier: Amsterdam, pp. 1167-1189, 2005 (Abstract submitted).

Slack, G. A "Crystallography and Domain Walls in Antiferromagnetic NiO Crystals" J. Appl. Phys., 31, 1571, 1960.

Messick, L.; Walker, W. C.; Glosser, R. "Direct and Temperature-Modulated Reflectance Spectra of MnO, CoO, and NiO" Phys. Rev. B, 6, 3941-3949, 1972.

Farazdel, A; Dupuis, M.; Clementi, E.; Aviram, A "Electric Field Induced Intramolecular Electron Transfer in Spiro a-Electron Systems and Their Suitability as Molecular Electronic Devices. A Theoretical Study" J. Am. Chem. Soc., 112, 4206-4214, 1990.

Dietz, R.; Parisot, G.; Meixner, A "Infrared Absorption and Raman Scattering by Two-Magnon Processes in NiO" Phys. Rev. B, 4, 2302-2310, 1971.

\* cited by examiner

P-TYPE TRANSPARENT CONDUCTING NICKEL OXIDE ALLOYS

CROSS-REFERENCE TO PRIOR FILED APPLICATIONS

This application claims priority to U.S. provisional application 62/347,157 which was filed on Jun. 8, 2016 which is incorporated herein in its entirety.

STATEMENT REGARDING FEDERALLY SPONSORED RESEARCH OR DEVELOPMENT

This invention was made with government support under Grant No. DESC0002120 awarded by the U.S. Department of Energy. The government has certain rights in the invention.

BACKGROUND

Solar energy conversion to electricity and fuels is the prime candidate for supplanting fossil fuels, which cause pollution that harms human health and contribute to global climate change by emitting carbon dioxide. To achieve this aim, different technologies suitable for various purposes have been emerging in the past few decades. In most of these technologies, a single semiconductor absorbs sunlight and then transports the photo-generated carriers to the external circuit or to the junction with the electrolyte. However, some light absorbers, such as dye molecules in dye-sensitized solar cells, are poor charge conductors. Other light absorbers, such as typical low-gap semiconductors, are not stable enough to be exposed to electrolytes, and therefore are not suitable for use in photocatalytic technologies.

One strategy to overcome these barriers is to separate light absorption and charge conduction components of the device. For this purpose, the light absorber could inject the photogenerated carrier into a wide-gap semiconductor with higher conductivity (commonly dubbed a transparent conducting oxide (TCO)) that does not absorb visible light, and therefore does not interfere with light-absorption and carrier generation. Such technologies require the use of suitable TCOs with high enough conductivities.

Common n-type electron conductors are TiO2 and ZnO, which are widely used in many technologies such as n-type dye-sensitized solar cells. However, finding an effective p-type TCO is still an active area of research, as available p-type TCOs generally have lower conductivities than their n-type counterparts. A widely used p-type TCO is nickel oxide, which has a band gap of 3.6-4.6 eV and is intrinsically p-type due to Ni vacancies in its lattice structure. Producing highly conducting NiO samples—and preferably crystals that maintain the rock-salt structure of NiO with minimal structural distortion—for use as p-type TCOs has attracted extensive interest in the past decade.

Thus, highly conductive p-type TCOs that have a rock-salt structure are therefore highly desirable.

SUMMARY OF THE INVENTION

The present disclosure is drawn to a composition of matter that functions as a p-type transparent conductive oxide, and specifically a rock salt structure that is a substitutional alloy having the formula: $M_xNi_{1-x}O$, where M is Mg or Zn, and $0<x<1$. Among the many possibilities considered, the composition could advantageously be configured such that $0.2 \leq x \leq 0.3$, or that x is about 0.25. It is also contemplated that the quasiparticle gap is between 3.3 and 4.4. It is further contemplated that the spin configurations in the presence of a hole include singly occupied O 2p orbitals and filled Mg 2p or Zn 3d orbitals. This composition can be used in devices, and it is contemplated that such devices may include n-type semiconductors containing titanium dioxide, or that the thickness of a layer of the device containing the composition may be between about 500 nm and about 100 micrometers. Further, it is contemplated that such devices may also include electrolytes, dye molecules, conducting layers, electron donor layers, electron acceptor layers, light absorbing layers, and/or amorphous silicon layers.

DETAILED DESCRIPTION

Figure 1A:
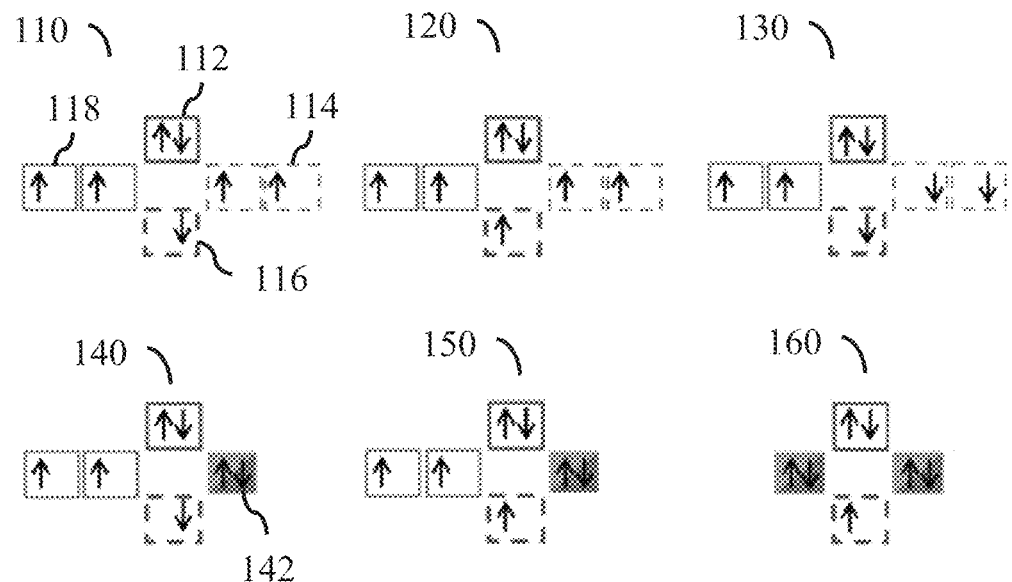
FIG. 1A is a schematic representation of possible spin configurations in pure NiO and embodiments of the present invention.

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

It must be noted that as used herein and in the appended claims, the singular forms "a", "an", and "the" include plural referents unless the context clearly dictates otherwise.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

Disclosed is a composition of matter with a rock salt structure, where the composition is a substitutional alloy having the formula $M_xNi_{1-x}O$, where M is Mg or Zn, and $0<x<1$. In preferred embodiments, $0.2 \leq x \leq 0.3$. In more preferred embodiments, x is about 0.25.

It has been shown previously that the movement of a hole in pure nickel oxide is confined to two dimensions, along a single ferromagnetic plane. Such confinement may hamper hole transport when NiO is used as a p-type transparent conductor in various solar energy conversion technologies.

In order to introduce three dimensional (3D) transport, the substitutional alloy has to satisfy four conditions.

The first condition is that M (Mg or Zn) ions should not cause the holes to be trapped on the adjacent O sites, i.e., there must exist a pathway in which the energy barrier $E^A$ for moving the hole away from the vicinity of $M^{2+}$ is about 0.1 eV, which is the minimum adiabatic energy barrier for hole transfer in pure NiO.

Hole transport in NiO is well described by the small polaron model. Polarons are localized charge carriers together with the distortion they cause in the geometry of their surrounding ions. In small polarons, this distortion does not extend significantly beyond a distance comparable to the lattice constant. The mobility of polaronic holes $\mu_h$ (which, along with the charge carrier concentration n, determines the conductivity $\sigma$ from $\sigma = ne\mu$, where e is the electronic charge) is proportional to the transfer rate of polarons $k_{ht}$ from a donor site D to an acceptor site A. Determining what impacts $k_{ht}$ is therefore crucial to understanding what controls $\sigma$.

The important parameter for characterizing $k_{ht}$ for polaron-hopping is the energy barrier $\Delta G^*$ that must be overcome in order for a hole to transfer from D to A. For the case of NiO, this transition occurs between adjacent O ions, i.e., $\psi_D \rightarrow \psi_A$, where $\psi_D$ is the wavefunction associated with configuration $O(D)^{1-}O(A)^{2-}$ and $\psi_A$ is the wavefunction associated with $O(D)^{2-}O(A)^{1-}$ configuration. A large energy barrier would lead to a smaller $k_{ht}$ for this process, which in turn would lead to lower conductivity.

In the parabolic approximation of Marcus, the diabatic energy barrier $\Delta G_{diab}^*$ can be found using diabatic Marcus curves. These parabolic curves describe the potential energy surfaces associated with distorting the equilibrium geometry $q_D$ of a hole localized on the donor towards the equilibrium geometry $q_A$ of a hole on the acceptor and vice versa. At an intermediate geometry $q_C$, the two curves associated with $\psi_D$ and $\psi_A$ intersect. The difference between the energy at $q_C$ and the energy associated with $\psi_D$ at $q_D$ corresponds to $\Delta G_{diab}^*$. Adiabatic corrections to find the adiabatic energy barrier $\Delta G_{adiab}^*$ can then be included by the relation $$\Delta G_{adiab}^* = -\frac{\lambda}{4} + \frac{(\lambda^2 + 4V_{AB}^2)^{\frac{1}{2}}}{2} - V_{AB}, \quad (1)$$

within the parabolic approximation. Here, $\lambda$ is the reorganization energy. It corresponds to the energy required to distort the geometric configuration associated with $\psi_D$ from $q_D$ to $q_A$, while the electron stays localized on the donor site. $V_{AB}$ is the coupling matrix element, which describes the coupling between $\psi_D$ and $\psi_A$ at $q_C$. It is related to the energy splitting $\Delta E$ between low-lying adiabatic states $\psi_g^{ad}$ and $\psi_u^{ad}$ at $q_C$ by $$V_{AB} = \frac{1}{2}\Delta E. \quad (2)$$

$\psi_g^{ad}$ and $\psi_u^{ad}$, which are symmetrically distributed over O(D) and O(A), are formed by the mixing of the diabatic $\psi_D$ and $\psi_A$ curves near $q_C$ when $V_{AB}$ is large. Characterizing hole transport in NiO or NiO-based alloys, therefore, involves generating the diabatic Marcus curves to calculate $\Delta G_{adiab}$ and $\lambda$, and calculating $V_{AB}$ to find $\Delta G_{adiab}^*$.

Aperiodic point charge (APC) embedding models were used together with unrestricted Hartree-Fock (UHF) and complete active space self-consistent field (CASSCF) theories to calculate all the parameters required to understand hole transport in NiO. The calculations predict the minimum $\Delta G_{adiab}$ for hole transport to be approximately 0.1 eV, in excellent agreement with the experimental range of 0.09 eV-0.14 eV.

To generate the diabatic Marcus curves for hole transport, UHF calculations were performed as implemented in the GAMESS quantum chemistry package. The 38-atom $[Ni_{10}O_{28}]^{35-}$ cluster was used as the reference cluster for the diabatic calculations. This cluster was embedded in an APC array to account for the electrostatic potential due to the surrounding ionic crystal structure.

The reference $[Ni_{10}O_{28}]^{35-}$ cluster consists of $Ni^{2+}$ and $O^{2-}$ ions. This cluster was carved out of the cubic halite crystal structure of NiO. Six O ions coordinated each Ni ion. This ensured a proper description of crystal-field splitting between Ni 3d ($e_g$) and Ni 3d ($t_{2g}$) orbitals. For each case involving the alloys, appropriate $Ni^{2+}$ ions were replaced by $Mg^{2+}$ or $Zn^{2+}$ in this cluster. All clusters were embedded in an aperiodic point charge (APC) array. The APC array accounts for the electrostatic potential due to the $Ni^{2+}$ and $O^{2-}$ ions in the surrounding crystal structure, which are not treated quantum-mechanically. The lattice constant used to build the clusters and the surrounding APC array was a=4.199 Å. This value corresponds to the equilibrium lattice constant resulting from geometry-relaxed DFT+U (U−J=3.8 eV) computations. Furthermore, it is in good agreement with the experimental value of 4.180 Å for pure NiO. The positive point charges (corresponding to $Ni^{2+}$ ions) immediately next to the $O^{2-}$ ions in the cluster were replaced by $Mg^{2+}$ effective core potentials (ECP). Unlike classical point charges, ECPs account for the Pauli repulsion due to the core electrons of the bordering cations. This repulsion would have been present in a real crystal and prevents the non-physical drift of electrons in the cluster towards the APC array. $Ni^{2+}$ ECPs were not available, so $Mg^{2+}$ ECPs were chosen instead. The ionic radius of $Mg^{2+}$ (72 pm) is very close to that of $Ni^{2+}$ (70 pm).

Before the central ions by the cluster and the ECPs were replaced, the APC array contained 8000 point charges, corresponding to a 10×10×10 array of eight-atom NiO cubic unit cells. Test calculations on the pure case have previously shown that increasing the size of the array to 11×11×11 changes the calculated $\Delta G_{diab}^*$ by less than 0.01 eV. Point charges with −2e and +2e charges in the APC represented the $O^{2-}$ and $Ni^{2+}$ ions, respectively.

The formal charges −2e, +2e and +2e for $O^{2-}$, $Ni^{2+}$, and $M^{2+}$ respectively (with M=Mg or Zn) were used to set the overall charge of each cluster. In each case one electron was removed to represent the hole. The hole was localized on the desired O site by first manually distorting the surrounding geometry (expanding the bonds near the hole to make the site more electrostatically favorable for hosting the hole). The orbitals of isolated ions were further used to construct an initial wavefunction guess for the UHF calculations. Orbitals corresponding to an isolated $O^{1-}$(instead of $O^{2-}$) were chosen for the site that hosts the hole. This technique was used to achieve an antiferromagnetic coupling between $Ni^{2+}$ ions in [111] direction (as observed experimentally),[1] and to achieve the possible spin configurations depicted in FIG. 1A. Consistent with previous calculations on pure NiO, the all-electron 6-31++G basis set (contracted as (11s5p1d/4s3p1d)) was used for O, and the Hay-Wadt VDZ basis set (contracted as (8s5p5d/3s3p2d)) for Ni, coupled with the HayWadt small core ECP that represents the Ni nucleus and its 1s, 2s, and 2p core electrons. For Mg ions an all-electron 6-31++G basis set (contracted as 17s11p1d/5s4p1d) was used. For Zn ions a Hay-Wadt VDZ basis set (contracted as (3s2p5d/2s2p2d)) was used with the corresponding HayWadt ECP that represents Zn nuclei and 1s, 2s, 2p, 3s and 3p core electrons.

For geometry relaxation, the geometry of the capping ECPs and the APC array were kept fixed. The O ions directly adjacent to the capping ECPs (i.e., the O ions at the edge of the clusters) were frozen in place as well, since the difference in charges on the neighboring Ni and capping ECP cations could lead to an unphysical distortion of the position of these O ions.

To generate the diabatic curves associated with hole removal from the vicinity of an M ion, i.e., to calculate $E_{diab}^A$, $[MNi_9O_{28}]_a^{35-}$ was built by replacing Ni(3) in $[Ni_{10}O_{28}]^{35-}$ by an M ion. There are no M ions in the pathway of hole transfer in this cluster. All possible spin configurations that could be formed between Ni(1), Ni(2), O(D) and O(A) in this cluster were studied, i.e., configurations 110, 120, and 130 in FIG. 1A. Next, to generate the diabatic curves and calculate $\Delta G_{diab}^*$ for hole movement along a single M ion, we replaced Ni (2) in $[Ni_{10}O_{28}]^{35-}$ by an M ion to form $[MNi_9O_{28}]_b^{35-}$. The two possible spin configurations for this case, configurations 140 and 150 in FIG. 1A, were studied. For the case of hole movement along two M ions, we substituted both Ni (1) and Ni (2) ions in $[Ni_{10}O_{28}]^{35-}$ by M ions to form $[M_2Ni_8O_{28}]^{35-}$. For this case there is a single possible spin configuration (configuration 160 in FIG. 1A) that can be formed between O(D), O(A) and the bridging cations along the way. In all clusters, it was ensured that $Ni^{2+}$ ions are anti-ferromagnetically coupled in the [111] direction, consistent with experiment.

When a hole is localized on an O ion, it distorts the geometry of the surrounding ions. To capture this distortion, the geometry when the hole is localized on O(D) and on O(A) was separately optimized. The linear coordinate approximation was then used to construct the intermediate structures between the donor $q_D$ and acceptor $q_A$ geometries. Within this approximation, each interpolating geometry $q_X$ is expressed as $$q_y = (1-y)q_D + yq_A \qquad (3)$$

where y is the fraction progressed along the nuclear reaction coordinate. The diabatic Marcus curves were generated by performing UHF calculations at these interpolating geometries. To generate the curves associated with the donor (acceptor) state, the UHF calculations were started from the wavefunction $\psi_D(\psi_A)$ at $q_D(q_A)$. $\Delta G_{diab}^*$ and $\lambda$ were determined using the generated curves for all the considered clusters for both $Mg_xNi_{1-x}O$ and $Zn_xNi_{1-x}O$ alloys.

Figure 2A:
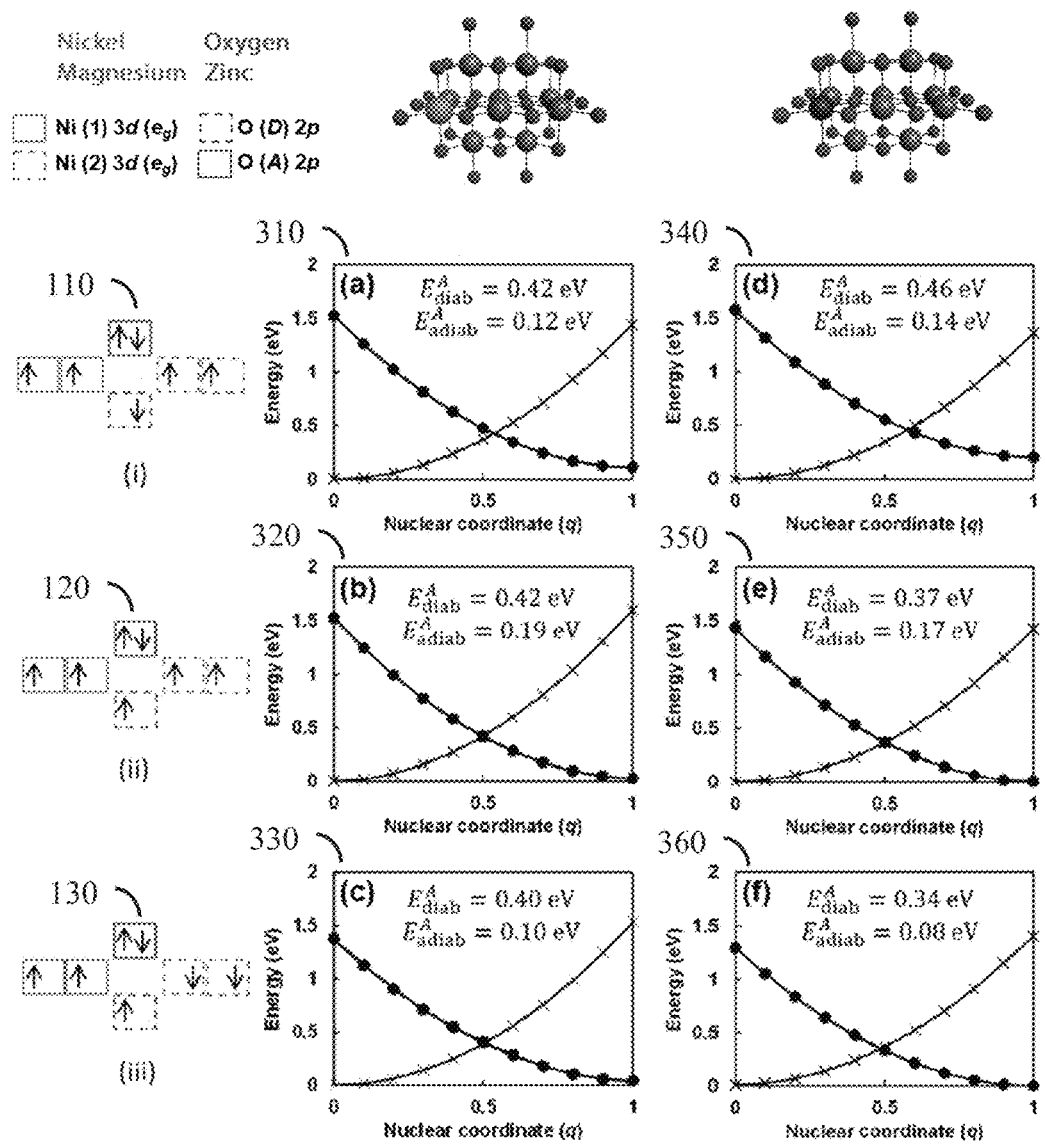
FIG. 2A depicts diabatic Marcus curves associated with moving a hole away from the vicinity of an Mg ion and Zn ion through spin configurations for the O(D), O(A), Ni(1), and Ni(2) ions.
Figure 2B:
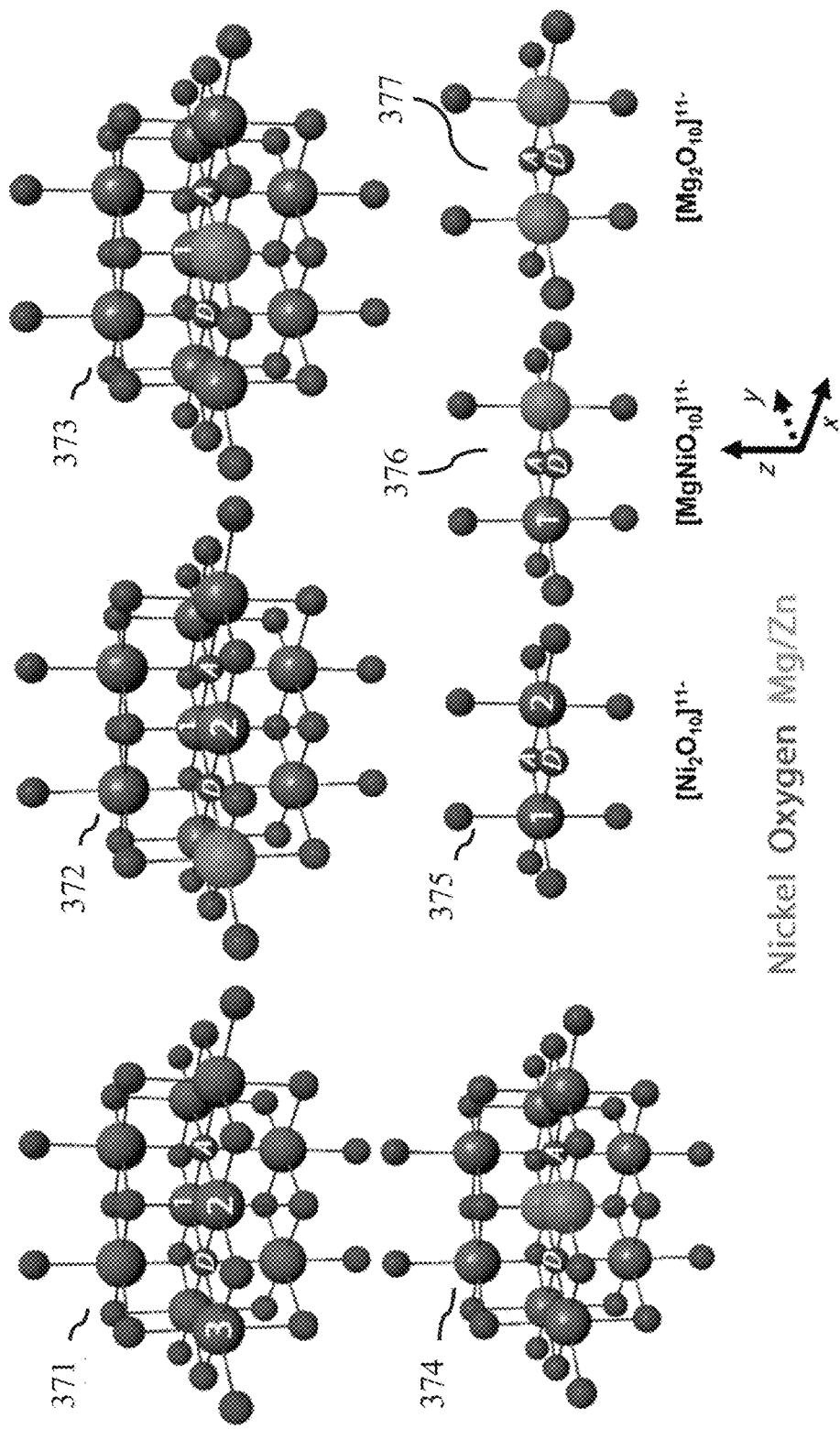
FIG. 2B depicts the embedded clusters used for generating diabatic Marcus curves.

To evaluate the energy splitting between low-lying adiabatic states, CASSCF calculations were performed as implemented in GAMESS, from which $V_{AB}$ was determined using Eq. 2. For these calculations, 12-atom clusters similar to $[Ni_2O_{10}]^{11-}$ were used, which contain O(D), O(A) and the cations comprising the hole transfer pathway. The CASSCF energies of the two lowest-lying adiabatic states are then used to calculate $V_{AB}$. For each spin configuration, these clusters were carved out of the corresponding 38-atom clusters at $q_C$. For the case of $[MNi_9O_{28}]_a^{35-}$ (used for calculating $E^A$) the corresponding 12-atom cluster is $[Ni_2O_{10}]^{11-}$. This cluster does not contain any M ions and has a geometry similar to that of the $[Ni_2O_{10}]^{11-}$ clusters used for calculating $V_{AB}$ in pure NiO. Therefore, the previously calculated $V_{AB}$ values for different spin configurations of the pure case were used to approximate $V_{AB}$ for spin configurations 110, 120, and 130 associated with $[MNi_9O_{28}]_a^{35-}$. For $[MNi_9O_{28}]_b^{35-}$ and $[M_2Ni_8O_{28}]^{35-}$ clusters, the corresponding 12-atom clusters we used were $[MNiO_{10}]^{11-}$ (with the two spin configurations 140 and 150) and $[M_2O_{10}]^{11-}$ (with spin configuration 160), respectively. FIG. 2B depicts the clusters used in generating the diabatic curves—$[Ni_{10}O_{28}]^{35-}$ (371), $[MNi_9O_{28}]_a^{35-}$ (372), $[MNi_9O_{28}]_b^{35-}$ (373), and $[M_2Ni_8O_{28}]^{35-}$ (374). FIG. 2B also depicts the clusters used for $V_{AB}$ calculations—$[Ni_2O_{10}]^{11-}$ (375), $[MNiO_{10}]^{11-}$ (376), and $[M_2O_{10}]^{11-}$ (377).

Eq. 1 was used to calculate $\Delta G_{adiab}^*$. $\lambda$ values were derived from the diabatic curves generated in each case, and $V_{AB}$ values were computed using Eq. 2 from the energy splitting between the ground and excited adiabatic states derived from the CASSCF calculations.

Figure 1B:
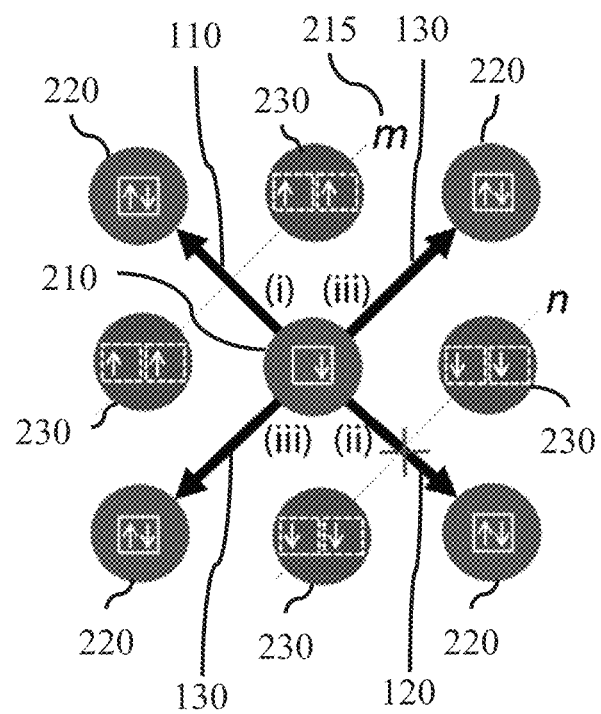
FIG. 1B is a schematic representation of possible pathways for hole transport in pure NiO.

In the calculations, all possible spin configurations were considered that could be formed between O(D), O(A), and the two Ni ions (Ni(1) and Ni(2)) that bridge these O ions. These configurations are shown in FIG. 1A, elements 110, 120, and 130, where the arrows in the box at the top of each element (112) indicates the O(A) 2p spins, the arrows in the dashed boxes on the right side of each element (114) indicate Ni(2) 3d ($e_g$) spins, the arrows on the dashed boxes on the bottom of each element (116) indicate the O(D) 2p spins, and the arrows in the boxes on the left side of each element (118) indicate Ni(1) 3d ($e_g$) spins. As seen in FIG. 1B, physically, these spin configurations are associated with different hole transport directions in relation to an adjacent (111) ferromagnetic plane m (215) with the spin opposite to that of the singly occupied 2p orbital of O(D). Spin configurations 110, 120, and 130 correspond to the movement of the hole through, away from, and parallel to plane m (henceforth denoted as →|m, ←|m, and ∥m), respectively. Remarkably, the barrier associated with spin configuration 120 (0.18 eV), which corresponds to ←|m, is significantly larger than that of the other two spin configurations (around 0.10 eV).

TABLE I

Calculated values associated with hole transport in pure NiO. These values show that hole transport in NiO is anisotropic and confined to the vicinity of a single (111) ferromagnetic plane. The anisotropy is due the higher barrier associated with spin configuration 120, which in turn is due to the lower $V_{AB}$ of this spin configuration.

| Spin Configuration/<br>Hole Transfer<br>Direction | $\Delta G_{diab}^*$ (eV) | λ (eV) | $V_{AB}$ (eV) | $\Delta G_{adiab}^*$ (eV) |
|---|---|---|---|---|
| 110/→ \|m | 0.36 | 1.38 | 0.32 | 0.10 |
| 120/← \|m | 0.38 | 1.47 | 0.21 | 0.18 |
| 130/\|\|m | 0.40 | 1.44 | 0.32 | 0.11 |

This implies considerable anisotropy in hole transport in NiO. Since the barrier for moving away from m is larger than the barrier to move parallel or through m, an individual hole in NiO will be confined to move alongside a single ferromagnetic plane m. This two-dimensional (2D) transport mechanism is detrimental to NiO's function as a TCO. The confinement leads to the undesirable effect of elongation of a hole's trajectory, increasing the likelihood of trapping caused by impurities or defects. Hence, finding ways to disrupt the 2D confinement is one way to improve NiO as a hole conductor.

The anisotropy in hole transport in NiO is the result of the difference in the spin configurations formed from the combination of the 3d ($e_g$) electrons of Ni(1) and Ni(2) and the electron in the singly occupied 2p orbital of O(D) or O(A). Therefore, a path to overcome hole confinement adjacent to plane m is to disrupt this magnetic structure at various locations in the crystal via substitutionally alloying NiO with non-magnetic metal oxides, which contain metals that are in their +2 oxidation state ($M^{2+}$). The objective of such alloying is to reduce the barrier associated with ←|m hole movement (configuration 120 in FIG. 1A) by replacing Ni(1), Ni(2), or both by $M^{2+}$. In other words, this strategy involves forming a random alloy in which, in addition to spin configurations 110, 120, and 130 in FIG. 1A already present in pure NiO, configurations 140, 150, and 160 in FIG. 1A could also exist. In configurations 140, 150, and 160, the arrows in the colored boxes on the right and/or left of each configuration indicate Mg 2p/Zn 3d spins. Configuration 140 is formed by replacing Ni (2) in spin configurations 110 and 130 by an M ion and corresponds to both ||m and →|m hole movement. Configuration 150 is formed by replacing Ni (2) in spin configuration 120 by an M ion and corresponds to ←|m. Finally, configuration 160 is formed by replacing both Ni(1) and Ni(2) by an M ion and could potentially correspond to any of the →|m, ←|m or ||m movements, depending on the spin of the Ni ions it replaces.

Pathways for Hole Transfer Away from $M^{2+}$ Vicinity

In the $Mg_xNi_{1-x}O$ alloy, the adiabatic energy barriers $E_{diab}^A$ for moving a hole away from $Mg^{2+}$ ions largely follow the same anisotropic characteristic as in pure NiO. FIG. 2A depicts diabatic Marcus curves associated with moving a hole away from the vicinity of an Mg ion and Zn ion considering various spin configurations for the O(D), O(A), Ni(1), and Ni(2) ions.

In FIG. 2A, graphs 310 and 340 relate to configuration 110 for Mg and Zn ions, respectively. Graphs 320 and 350 relate to configuration 120 for Mg and Zn ions, respectively. Graphs 330 and 360 relate to configuration 130 for Mg and Zn ions, respectively. In FIG. 2A, q=0 corresponds to the hole localized on O(D) adjacent to the M ion. Each case has been labeled by the corresponding $E_{diab}^A$ and $E_{adiab}^A$ for hole removal from the vicinity of an M ion. Specifically, the values are as follows:

TABLE II

| Spin Configuration/<br>Hole Transfer<br>Direction | $E_{diab}^A$, Mg Ion (eV) | $E_{adiab}^A$, Mg Ion (eV) | $E_{diab}^A$, Zn Ion (eV) | $E_{adiab}^A$, Zn Ion (eV) |
|---|---|---|---|---|
| 110/→ \|m | 0.42 | 0.12 | 0.46 | 0.14 |
| 120/← \|m | 0.42 | 0.19 | 0.37 | 0.17 |
| 130/\|\|m | 0.40 | 0.10 | 0.34 | 0.08 |

The cluster used to generate the diabatic curves (with the proper positioning of the M ion) is shown above the column associated with each case. In FIG. 2A, graphs 310, 320, and 330 deliver $E_{diab}^A$ and λ=1.52, 1.53, and 1.38 eV; these values and $V_{AB}$=0.32, 0.22, and 0.32 eV calculated in previous work, are then used to derive $E_{adiab}^A$ for configurations 110, 120, and 130 (see FIG. 1A), respectively. In this alloy, the $E_{diab}^A$ associated with all three spin configurations are nearly identical, approximately 0.4 eV. This lack of variation in $E_{adiab}^A$ was also observed in pure NiO. However, when including adiabatic corrections, $E_{adiab}^A$ associated with spin configurations 110 and 130 lie considerably lower than that for spin configuration 120. See FIG. 2A, graphs 310, 320, and 330, Table II.

The main source of this difference is the considerably lower value of $V_{AB}$ associated with spin configuration 120, which highlights the importance of including adiabatic corrections in studying hole transport pathways for NiO-based alloys. Overall, hole transport away from the vicinity of an $Mg^{2+}$ ion is anisotropic in the same fashion as in pure NiO.

$E_{adiab}^A$ values in $Zn_xNi_{1-x}O$ also point to anisotropy in hole transfer away from the vicinity of $Zn^{2+}$ ion (See FIG. 2A, 340, 350, 360) deliver $E_{diab}^A$ and λ=1.57, 1.44, and 1.29 eV; these values and the previously calculated $V_{AB}$=0.32, 0.22, and 0.32 eV are then used to derive $E_{adiab}^A$ for configurations 110, 120, and 130, respectively. However, the picture slightly differs from that of $Mg_xNi_{1-x}O$ in that $E_{adiab}^A$ associated with configuration 130 is distinctly lower than $E_{adiab}^A$ for configurations 110 and 120. Similar to the $Mg_xNi_{1-x}O$ case, the higher $E_{adiab}^A$ for configuration 120 stems from the lower value of $V_{AB}$. However, the high $E_{adiab}^A$ of configuration 110 is due to the fact that its $E_{diab}^A$ is approximately 0.1 eV higher than that of spin configuration 130, leading to a higher λ by almost 0.3 eV. Physically, hole removal away from the vicinity of $Zn^{2+}$ ions will most likely occur through spin configuration 130, without significant contribution from the other spin configurations.

A hole in the vicinity of $M^{2+}$ ions in both $Mg_xNi_{1-x}O$ and $Zn_xNi_{1-x}O$ alloys is a free hole, since it can move away from the O ion adjacent to $M^{2+}$ through spin configuration 130 by overcoming an energy barrier $E_{adiab}^A$ of approximately 0.1 eV, which is comparable to the minimum $\Delta G_{adiab}^*$ in pure NiO. Spin configuration 110 is also a pathway for hole removal away from $Mg^{2+}$ in $Mg_xNi_{1-x}O$, albeit with a slightly higher energy barrier (approximately 0.12 eV). In sum, a hole will not be trapped in the vicinity of $M^{2+}$ ions, and therefore, the first condition for a potential alloying partner that could create 3D transport in NiO is aptly satisfied.

The second condition is that the alloy should still be optically transparent, i.e., its band gap should not differ significantly from that of NiO (3.0-4.6 eV). In preferred embodiments, the composition has a gap of between 3.3 and 4.4. In other embodiments, the quasiparticle gap is between 3.3 and 3.8. In still other embodiments, the quasiparticle gap is between 3.4 and 3.7.

To assess the optical transparency of these materials, single-shot G0W0 calculations were performed as implemented in the VASP electronic structure package version 5.2.2, to find the quasiparticle gap associated with MgxNi1−xO and ZnxNi1−xO, at x=0.25. G0W0 calculations were performed as a perturbation on the one-electron eigenvalues and wavefunctions derived from ground state density functional theory (DFT)+U while using the Perdew-Burke-Ernzerhof (PBE) exchange-correlation functional (henceforth denoted as PBE+U/G0W0). PBE+U/G0W0 calculations achieve excellent agreement with experiment for the quasiparticle gap of pure NiO. Calculations were performed on a special quasirandom structure (SQS) unit cell. SQS cells mimic the correlation function of a random alloy solid solution. The equilibrium geometry for these SQS cells was optimized using PBE+U ground state calculations. These geometries provided the input for the G0W0 calculations.

For both alloys, spin-polarized, all-electron, frozen-core, projector augmented-wave (PAW) density functional theory (DFT)+U calculations were performed. Standard DFT fails to describe the ground state electronic structure of NiO (and its alloys) since it does not correct for self-interaction error (SIE). SIE is caused by the approximate nature of DFT exchange-correlation (XC) functionals, which fail to cancel a spurious repulsion of an electron by itself, caused by the mean-field treatment of Hartree repulsion in DFT. This problem is exacerbated in NiO, which contains a large number of tightly-bound, open-shell Ni 3d electrons. DFT+U accounts for SIE by introducing Hartree-Fock (HF)-like average Coulomb (U) and exchange (J) terms to correct intraatomic exchange interactions between Ni 3d electrons. With an appropriate U−J value, DFT+U predicts NiO to be a semiconductor, thereby describing ground state NiO quite well.

The Dudarev et al. DFT+U formalism was employed, with the PBE generalized gradient approximation (GGA) XC functionals. The ab-initio-derived U−J=3.8 eV for Ni2+ ions was used in the PBE+U calculations. The default PAW potentials in VASP were deployed to treat the nuclei and core electrons of the O, Ni, Mg and Zn atoms. The O, Ni, Mg and Zn PAW potentials account for the O 1s, Ni 1s2s2p3s3p, Mg 1s, and Zn 1s2s2p3s3p core electrons, respectively. The directions of the initial magnetic moments on the Ni atoms were set to find states that are antiferromagnetic in the [111] direction, consistent with experiment.

The PBE+U calculations were performed with a 4×8×2 Γ-point-centered k-point mesh, with 160 bands (104 and 94 empty bands for ZnO and MgO alloys, respectively) and a plane-wave basis kinetic energy cutoff of 700 eV. During geometry relaxation at the PBE+U level, we used Gaussian smearing for Brillouin zone integration, with a smearing width of 0.05 eV. However, Brillouin zone integration was performed using the tetrahedron method with Blöchl corrections for the final calculations on equilibrium structures. The tetrahedron method leads to more accurate energies and densities of states (DOS). The total energy was converged to within 1 meV per atom for these settings.

$G_0W_0$ calculations used a 4×8×2 Γ-point-centered k-point mesh, a 2×4×2 q-point mesh to evaluate the dielectric response function, 104 and 94 empty bands for MgO and ZnO alloying, respectively, and 96 frequency points for the evaluation of the response function. At these values, which are consistent with the converged values for pure NiO and other NiO alloys, the quasiparticle gap was converged to within 0.1 eV.

Figure 3A:
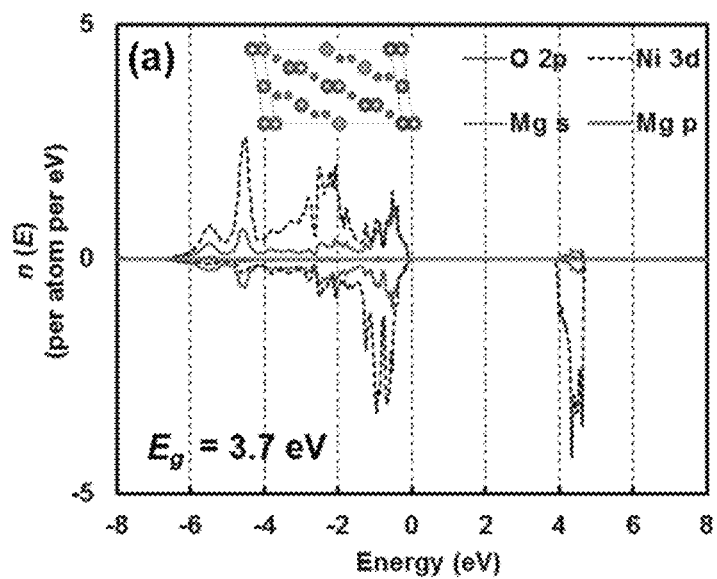
FIG. 3A depicts the projected density of states (PDOS, n(E)) predicted by PBE+U/G0W0 calculations for $Mg_{0.25}Ni_{0.75}O$ alloys.
Figure 3B:
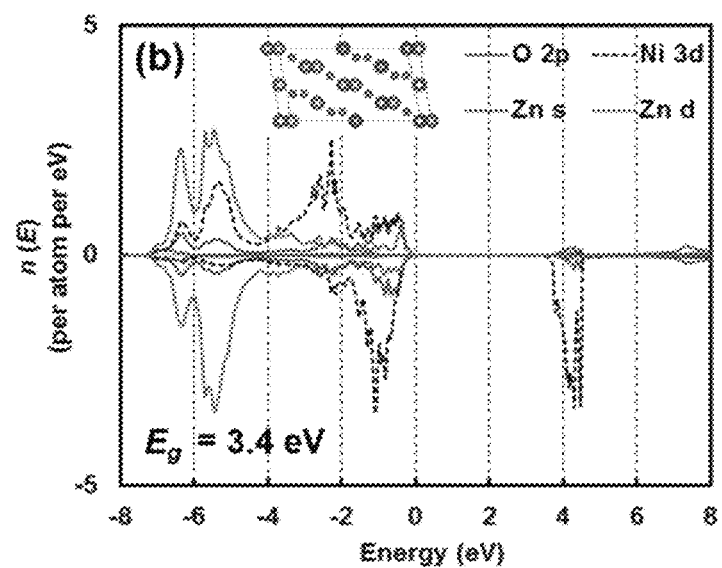
FIG. 3B depicts the projected density of states (PDOS, n(E)) predicted by PBE+U/G0W0 calculations for $Zn_{0.25}Ni_{0.75}O$ alloys.

PBE+U/$G_0W_0$ calculations on $Mg_{0.25}Ni_{0.75}O$ and $Zn_{0.25}Ni_{0.75}O$ alloys clearly prove that these two materials are optically transparent oxides (See FIGS. 3A and 3B).

Note that the insets in FIGS. 3A and 3B show the 16-atom, special quasirandom structure unit cells used for the calculations. Ni, O, Mg, and Zn ions are shown as gray, red, green, and purple balls, respectively. The Fermi level is at zero; majority (minority) spin PDOS shown as positive (negative) values of n(E). The quasiparticle gap associated with both alloys differs only slightly from that of pure NiO (3.6 eV).

These calculations predict a quasiparticle gap of 3.7 eV and 3.4 eV for $Mg_{0.25}Ni_{0.75}O$ and $Zn_{0.25}Ni_{0.75}O$, respectively. These gaps lie very close to the quasiparticle gap of pure NiO, which is 3.6 eV. The main reason that the band gap of $Mg_{0.25}Ni_{0.75}O$ lies very close to that of pure NiO is the fact that Mg states are not heavily involved at the valence and conduction band edges. This is not surprising, given the much larger band gap of MgO (approximately 7.8 eV) compared to NiO's band gap. When it comes to $Zn_{0.25}Ni_{0.75}O$, Zn d states have a small presence in the vicinity of the valence band edge. The hybridization of these states with the O p and Ni d states is the likely reason for the slight decrease (approximately 0.2 eV) compared to the band gap of pure NiO. However, this hybridization is too small to cause any major deviation from the band gap of NiO upon forming the $Zn_{0.25}Ni_{0.75}O$ alloy.

Given that the $G_0W_0$ quasiparticle gap is directly comparable to the gap measured by photoemission/inverse photoemission spectroscopy, our results are a strong indication that alloying NiO with MgO or ZnO (at least up to 25% Zn or Mg concentration) will not deleteriously affect its optical transparency. Furthermore, both $Mg_{0.25}Ni_{0.75}O$ and $Zn_{0.25}Ni_{0.75}O$ alloys preserve the charge-transfer characteristic of NiO's band gap, as evidenced by the significant presence of O 2p states at the valence band edge. The charge-transfer character could lead to longer charge carrier lifetimes in oxides. Overall, alloying with MgO and ZnO, especially at or around 25% concentration, not only preserves optical transparency but also keeps unaltered the favorable charge transfer character of NiO, which contributes to NiO's usefulness as a hole conductor.

The third and fourth requirements are related. The third requirement is that configuration 140 must have an energy barrier around 0.1 eV, i.e., comparable to that of configurations 110 and 130. This ensures that →|m and ||m are not deleteriously affected when the hole moves alongside an M ion through configuration 140. Given that configuration 160 could also appear for any of the three directions of hole movement, the hole transfer barrier in this configuration should also be comparable to those of 110 and 130.

The fourth requirement is that configuration 150 should have a significantly lower barrier than that of configuration 120. In other words, the barrier for ←|m should be considerably reduced when an M ion substitutes an Ni ion in the path of hole movement from O(D) to O(A).

Energy Barrier to Move Away from Plane m
Diabatic Energy Barrier

Replacing one or two Ni ions in NiO by Mg or Zn ions in the pathway of hole transfer between two 0 ions does not change the value of $\Delta G_{diab}^*$ significantly, compared to $\Delta G_{diab}^*$ of pathways along two Ni ions. (FIG. 4; compare Table III with Table I, $\Delta G_{diab}^*$ for spin configurations 110, 120, and 130)).

TABLE III

| Config | $\Delta G_{diab}^*$, Mg Ion (eV) | $V_{AB}$, Mg Ion (eV) | $\Delta G_{diab}^*$, Mg Ion (eV) | $\Delta G_{diab}^*$, Zn Ion (eV) | $V_{AB}$, Zn Ion (eV) | $\Delta G_{diab}^*$, Zn Ion (eV) |
|---|---|---|---|---|---|---|
| 140 | 0.37 | 0.31 | 0.11 | 0.38 | 0.36 | 0.10 |
| 150 | 0.37 | 0.32 | 0.11 | 0.36 | 0.31 | 0.12 |
| 160 | 0.35 | 0.36 | 0.08 | 0.38 | 0.35 | 0.10 |

Spin configuration 140 is the result of replacing Ni (2) by an Mg or Zn ion in configurations 110 or 130 of the pure NiO case. Such a replacement leads to $\Delta G_{diab}^*$ values of 0.37 and 0.38 eV for MgO and ZnO alloying, respectively, close to the $\Delta G_{diab}^*$ values of spin configurations 110 and 130 in the pure case (0.36-0.40 eV, Table I). Likewise, after replacing Ni (2) by either Mg or Zn ions in configuration 120 of the pure NiO case (i.e., forming configuration 150), $\Delta G_{diab}^*$ decreases by only 0.01-0.02 eV (from 0.38 eV in the pure NiO case) to 0.37 and 0.36 eV for Mg and Zn, respectively. This trend continues when both Ni (1) and Ni (2) are replaced by Mg or Zn ions, forming configuration 160. In this case, $\Delta G_{diab}^*$ for the $Mg_xNi_{1-x}O$ case (0.35 eV) is only slightly lower than the range of values found in the pure NiO case (0.36-0.40 eV) while the corresponding value for the $Zn_xNi_{1-x}O$ case (0.38 eV) lies within that range. Overall, the results indicate that alloying with either MgO or ZnO does not significantly alter the diabatic energy barriers when the hole transfer occurs alongside an $M^{2+}$ ion. Therefore, within the diabatic limit, alloying with MgO or ZnO does not aid in reducing the barrier associated with spin configuration 120 in pure NiO and the objective to facilitate 3D transport through this barrier reduction is not achieved. However, this conclusion does not hold after including adiabatic corrections.

Adiabatic Corrections

The CASSCF calculations on $[MNiO_{10}]^{11-}$ (see FIG. 2B, element 376) and $[M_2O_{10}]^{11-}$ (see FIG. 2B, element 377) clusters, carved out from the larger $[MNi_9O_{28}]^{35-}$ clusters (see FIG. 2B, elements 372, 373) at their intermediate geometry $q_C$, show that hole transport between O ions alongside the M ions are strongly adiabatic (see Table III). The $V_{AB}$ values for the considered cases, calculated from the energy splitting between the lowest lying adiabatic states (Eq. (2)), range from 0.31 to 0.36 eV. These $V_{AB}$ values are all comparable or higher than those of configurations 110 and 130 of the pure NiO case (Table I). This indicates strong adiabaticity, as $V_{AB}$ values of this magnitude are more than an order of magnitude higher than thermal energy at room temperature (26 meV). Furthermore, the adiabaticity criterion that the transition probability K between a donor and an acceptor should equal unity is satisfied at these $V_{AB}$ values. This probability is given by $\kappa = 2P_{12}^0/(1+P_{12}^0)$, where $$P_{12}^0 = 1 - e^{-\left(\frac{V_{AB}^2}{h\nu_N}\right)\left(\frac{\pi^3}{\lambda k_B T}\right)^{1/2}} \qquad (4)$$

is the probability of hopping in a single passage through $q_C$. Here, $V_N$ is the effective frequency for nuclear motion, h is Planck's constant, $k_B$ is Boltzmann's constant, and T is temperature. At room temperature (T=300 K) and $\nu_N$ approximately $3.27 \times 10^{13}$ Hz (approximated using the frequency of the highest infrared active longitudinal optical mode phonon), the $V_{AB}$ and $\lambda$ values associated with all configurations 140, 150, and 160 lead to $\kappa = P_{12}^0 = 1$. Therefore, as in pure NiO, hole transport between O ions alongside these $M^{2+}$ ions is strongly adiabatic for both of these alloys.

Figure 4:
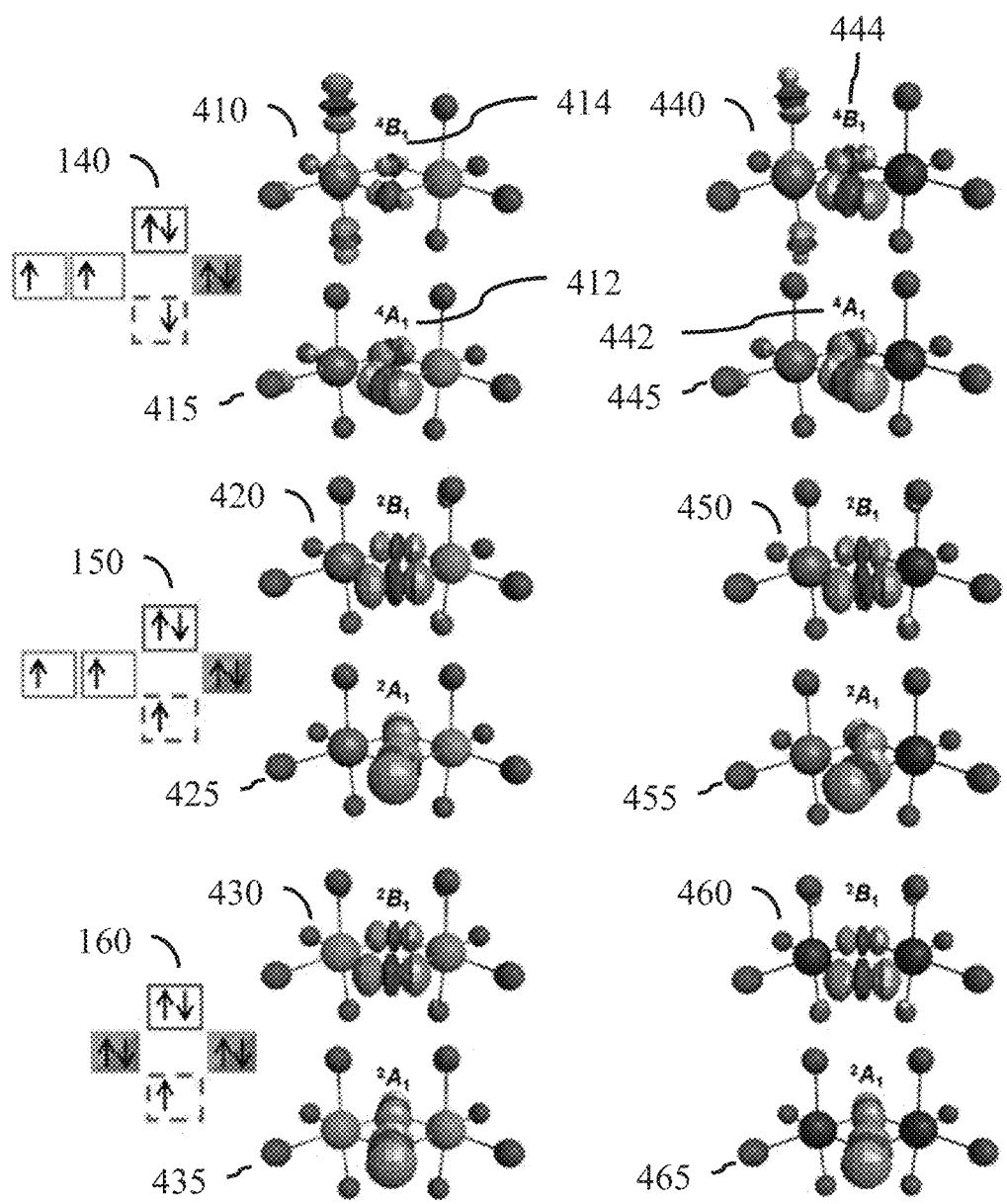
FIG. 4 depicts the electron density difference between each adiabatic hole state associated with the different spin configurations in the presence of Mg and Zn ions, and a cluster without the added hole at the same geometry.

The pairs of adiabatic states associated with each of the configurations 140, 150, and 160 for both $Mg_xNi_{1-x}O$ and $Zn_xNi_{1-x}O$ alloys are prominently O 2p states, as evidenced by electron density difference plots (FIG. 4).

FIG. 4 depicts the electron density difference between each adiabatic hole state associated with the different spin configurations (140, 150, and 160) in the presence of Mg ions (410, 420, and 430, respectively) and Zn ions (440, 450, and 460, respectively), and a cluster without the added hole at the same geometry (415, 425, 435, 445, 455, and 465). Negative density difference (gold color) indicates the presence of a hole. Each pair in 410/440, 420/450, and 430/460 represents the lowest-lying adiabatic states associated with spin configurations 140, 150, and 160, respectively. Table III contains each pair's corresponding $\Delta G_{diab}^*$, $V_{AB}$, and $\Delta G_{adiab}^*$ resulting from their energy splitting. The opposite parity (evidenced by the different local point group symmetry) between each pair and the symmetric distribution of charge density between the central O ions show that these are the relevant adiabatic states.

These plots display the location of the hole by taking the difference between the electron density of the adiabatic hole state and that of the ground state of the cluster without the added hole. These states are symmetrically distributed over O(D) and O(A). Furthermore, they have opposite parities with respect to each other (with ground states having $A_1$ and excited states having $B_1$ local point group symmetries). This is consistent with the fact that the lower- and higher-lying adiabatic states are formed from the symmetric and antisymmetric mixing of the diabatic states, respectively. These qualities indicate that the adiabatic states for which we calculated $V_{AB}$ are the relevant states to be considered.

The spatial distribution of the holes associated with the adiabatic states of spin configurations 140 and 150 closely resemble that of the corresponding spin configuration in the pure NiO case. For configuration 140 in both $Mg_xNi_{1-x}O$ and $Zn_xNi_{1-x}O$, the lower-lying adiabatic states ($^4A_1$ states in FIG. 4, 412 and 442) are concentrated around O(D) and O(A), whereas the higher-lying states are more delocalized, with contributions from other O ions in the cluster ($^4B_1$ states in FIG. 4, 414 and 444). Such a delocalization was also observed in the adiabatic states of spin configurations 110 and 130 in the pure NiO case, which correspond to the same hole movements as spin configuration 140 (→|m and ||m). Similarly, the spatial distribution of the adiabatic states associated with spin configuration 150 (FIG. 4, 420 and 450) strongly resembles that spin configuration 120. Both of these states correspond to the movement of a hole away from plane m (←|m). The similarity between the adiabatic states of configurations 140 and 150 to those of their corresponding configurations in the pure NiO case is yet another piece of strong evidence that the $V_{AB}$ values are calculated from appropriate adiabatic states.

Forming spin configuration 140 by replacing Ni (2) with an Mg ion in spin configuration 110 or 130 of the pure NiO case leads to a $\Delta G_{adiab}*$ of 0.11 eV [The $\Delta G_{adiab}*$ values are derived using Eq. (1) and the above $V_{AB}$ values and $\lambda$=1.44, 1.48, 1.39, 1.50, 1.46, and 1.47 eV, extracted from UHF diabatic energy curves (not shown) for the cases 410, 420, 430, 440, 450, and 460, respectively.]. This $\Delta G_{adiab}*$ is comparable to the energy barrier 0.10-0.11 eV for spin configurations 110 and 130 in the pure NiO case. Similarly, Zn inclusion leads to $\Delta G_{adiab}*$ of 0.10 eV. Therefore, not only is adiabaticity not deleteriously impacted for →|m and ||m hole transfer pathways (corresponding to 110 and 130 spin configurations in the pure NiO case and 140 in the case with M inclusion) but also the adiabatic activation barrier does not change for these hole transfer pathways. This means that a hole in $Mg_xNi_{1-x}O$ and $Zn_xNi_{1-x}O$ can still propagate parallel to and through the plane m alongside an M ion at the same rate as in pure NiO.

The remarkable difference that Mg/Zn inclusion makes in the transport landscape of NiO occurs through the reduction of the barrier associated with ←|m (i.e., configuration 120 in pure NiO) through formation of spin configurations 150 and 160. $\Delta G_{adiab}*$ values for spin configuration 150, which results from replacing Ni (2) by an M ion in spin configuration 120 of the pure NiO case, are 0.11 and 0.12 eV for $Mg_xNi_{1-x}O$ and $Zn_xNi_{1-x}O$, respectively. These values are considerably lower than 0.18 eV, the value for spin configuration 120 of the pure NiO case (Table I), which corresponds to the same hole transfer pathway as spin configuration 150, ←|m. Furthermore, this barrier is comparable to that of the 0.10-0.11 eV range of $\Delta G_{adiab}*$ values associated with hole transfer pathways of →|m and ||m (i.e., spin configurations 110 and 130 in pure NiO and spin configuration 140 in $Mg_xNi_{1-x}O$ and $Zn_xNi_{1-x}O$). This means that when a hole lands on an O(D) site that forms spin configuration 150 with its adjacent cations, it can make a ←|m transition at nearly the same rate as →|m and ||m hole transfer in pure NiO. Such a transition would have been unfavorable in pure NiO, given the high barrier associated with spin configuration 120. Thus, forming $Mg_xNi_{1-x}O$ and $Zn_xNi_{1-x}O$ substitutional alloys leads to a reduction in the barrier for ←|m hole transfer at certain sites where configuration 150 is available, leading to the possibility for holes to move away from the plane to which they are confined. After moving away from this plane through configuration 150, the hole can then move away from the Mg or Zn ion through the pathway represented by cluster $[MNi_9O_{28}]_a^{35-}$ (FIG. 2B, element 372) and spin configuration 130 and continue its propagation as a free hole.

Spin configuration 150 is not the only configuration through which the 2D confinement of holes in NiO can be disrupted by forming $Mg_xNi_{1-x}O$ and $Zn_xNi_{1-x}O$ alloys. $\Delta G_{adiab}*$ for configuration 160 in $Mg_xNi_{1-x}O$ and $Zn_xNi_{1-x}O$ alloys is 0.08 eV and 0.10 eV, respectively. (See FIG. 4, Table III). These values are considerably smaller than the 0.18 eV value for spin configuration 120 in the pure NiO case. They are also smaller or the same as those of spin configurations 110 and 130 of pure NiO (0.10-0.11 eV). This means that $\Delta G_{adiab}*$ associated with the ←|m hole transfer pathway can be reduced to a value comparable to (or even lower than) that of →|m and ||m at sites where the Mg/Zn ions replace both Ni (1) and Ni (2) in spin configuration 120. Therefore, configuration 160 provides yet another pathway for a hole to move away from the plane to which it is confined in pure NiO.

To assess whether spin configurations 150 and 160 can ultimately help to achieve 3D transport in NiO by forming $Mg_xNi_{1-x}O$ and $Zn_xNi_{1-x}O$, we need to evaluate the abundance of these configurations in a random alloy. Specifically, we need to find the proportion of pathways with spin configuration 120 in pure NiO that will be replaced by either the 150 or the 160 spin configurations when alloys are formed. For each O(D), there exist three pathways with spin configuration 120, formed by the three Ni ions that have the same spin as the unpaired electron in the 2 p orbital of O(D). Configurations 150 and 160 occur when one or more of these three Ni ions are replaced by Mg or Zn ions. Let us consider the x=0.25 case, for which we showed that $Mg_xNi_{1-x}O$ and $Zn_xNi_{1-x}O$ are optically transparent. X=0.25 means that there is a 25% chance for any site to be occupied by Mg or Zn instead of Ni. By the binomial theorem then, at 0.25 concentration, approximately 55% of O(D) sites will exist in spin configurations 150 or 160, formed by replacing Ni (1), Ni (2), or both, in spin configuration 120. Therefore, a hole will have the chance to move away from the plane to which it is confined at more than half of the sites while it is propagating through the crystal. Overall then, these calculations show that substitutionally alloying NiO with MgO or ZnO leads to formation of abundant sites that will facilitate hole movement in directions that are not favorable in pure NiO. It must be noted that in real samples, the presence of O or Ni vacancies (which leads to intrinsic n and p doping, respectively) also interferes with hole transport in these alloys by causing trapping and scattering; however, such interference exists in both pure NiO and the $Mg_xNi_{1-x}O$ and $Zn_xNi_{1-x}O$ alloys. Therefore, the 3D hole transport in $Mg_xNi_{1-x}O$ and $Zn_xNi_{1-x}O$ alloys will still make these alloys superior hole transporters compared to pure NiO samples.

When producing $Mg_xNi_{1-x}O$ and $Zn_xNi_{1-x}O$ substitutional alloys, these compositions can be fabricated by substitutionally alloying nickel (ii) oxide with Mg or Zn in the (Mg,Ni)O or (Zn,Ni)O structure. In some embodiments, these compositions can be fabricated by, for example, sputter deposition, pulsed laser deposition (PLD), atomic layer deposition (ALD), atomic layer epitaxy (ALE), or molecular beam epitaxy (MBE). Colloidal synthesis techniques can also be used for creating nano-structured transition-metal oxide alloys.

These compositions can be used in various devices. In particular, the device may comprise a first layer comprising the disclosed composition.

Figure 5A:
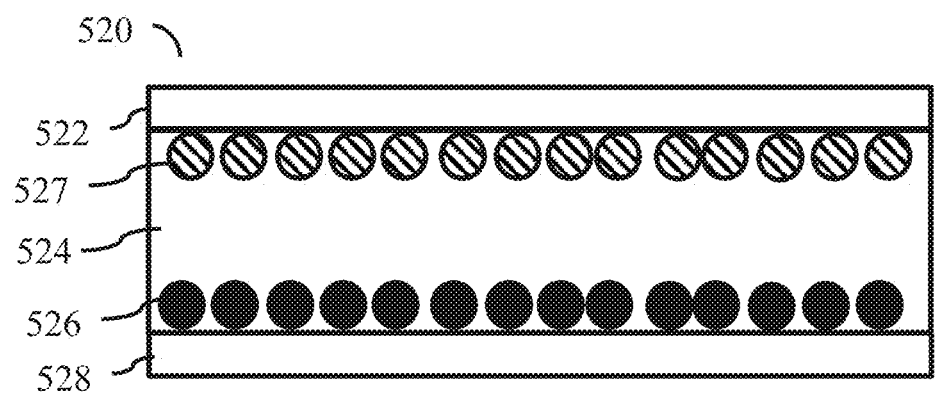
FIG. 5A-D illustrates various device utilizing embodiments of the disclosed composition of matter.

In some embodiments, depicted in FIG. 5A, the device (520) comprises the first layer (522) comprising the disclosed composition, as well as an electrolyte (524), one or more types of dye molecules (526, 527) which may be coated on a titanium dioxide or other n-type semiconductor layer and the disclosed layer, and a conducting layer (528). Such devices can be utilized as, for example, dye-sensitized solar cells.

Figure 5B:
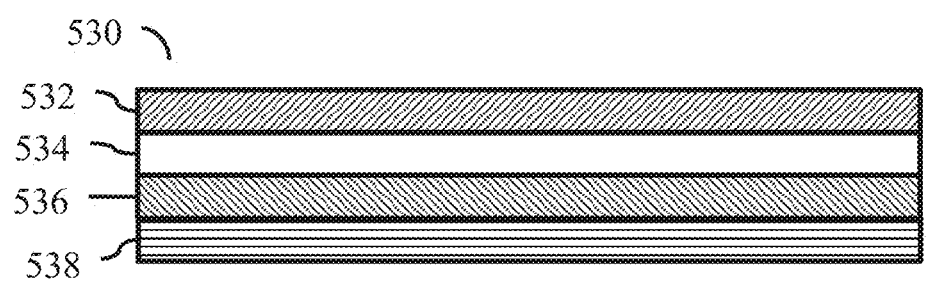

In still other embodiments, depicted in FIG. 5B, the device (530) comprises the first layer (532) comprising the disclosed composition, as well as an electron acceptor layer (534), an electron donor layer (536), and a conducting layer (538). These devices can be utilized as, for example, organic solar cells.

Figure 5C:
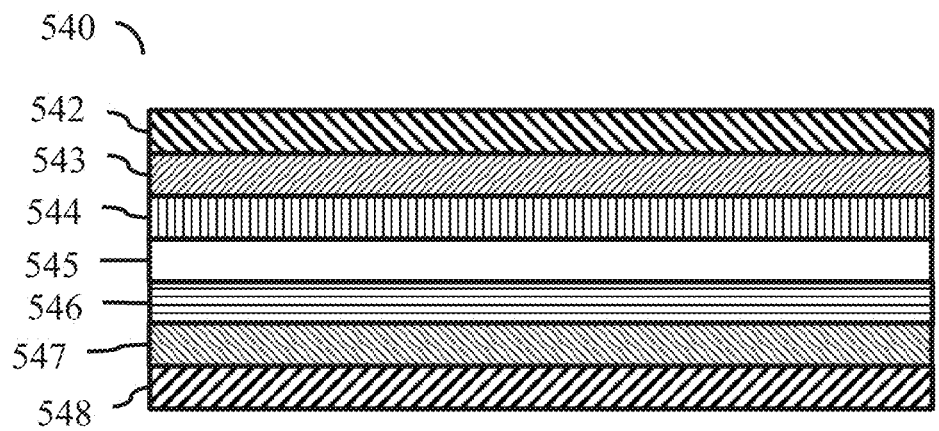

In still other embodiments, depicted in FIG. 5C, the device (540) comprises the first layer (542) comprising the disclosed composition, as well as, for example, a hole injection layer (HIL) (543), a hole transport layer (HTL) (544), and a light-absorbing layer (545). Further, the device (540) may also comprise an electron transport layer (ETL) (546), an electron injection layer (EIL) (547) and a conducting layer (548). Not all layers are required in every device; in some embodiments, only the first layer (542), the light absorbing layer (545), the conducting layer (548), and at least one of the electron injection layer (EIL) (547) or hole injection layer (HIL) (543) are utilized. These devices can be used as, for example, polymer-bulk-heterojunction solar cells.

Figure 5D:
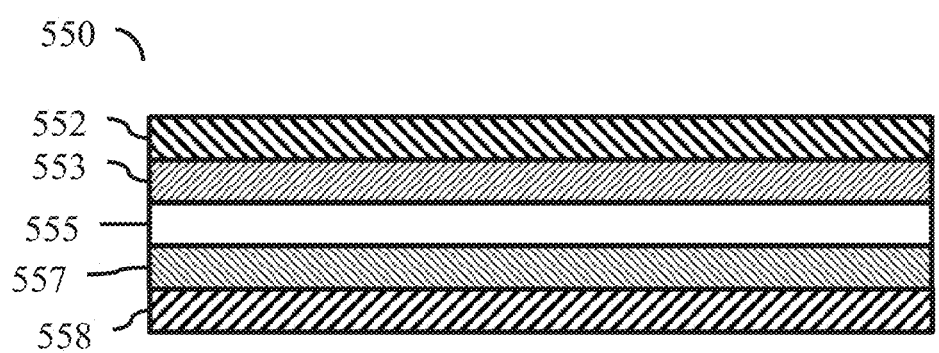

In certain embodiments, the disclosed composition may be utilized in amorphous silicon solar cells. As shown in FIG. 5D, such a device (550) may comprise the first layer (552) comprising the disclosed composition, as well as one or more amorphous silicon layers (553, 555, 557) in this example, these layers correlated with p-type amorphous silicon, i-type amorphous silicon, and n-type amorphous silicon, respectively. In addition, a conducting layer (558) is utilized.

Thus, specific compositions and devices utilizing p-type transparent conducting oxides have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed:

1. A composition of matter with a rock salt structure comprising a substitutional alloy having the formula:
$Mg_xNi_{1-x}O$, where M is Mg or Zn, and $0<x<1$,
wherein spin configurations in the presence of a hole include singly occupied O 2p orbitals and filled Mg 2p or Zn 3d orbitals.

2. The composition of matter according to claim 1, wherein $0.2 \leq x \leq 0.3$.

3. The composition of matter according to claim 1, wherein x is 0.25.

4. The composition of matter according to claim 1, wherein a quasiparticle gap is between 3.3 and 4.4.

5. A device comprising:
A first layer, the first layer comprising a p-type semiconductor substitutional alloy having a rock salt structure, the p-type semiconductor alloy comprising the formula: $Mg_xNi_{1-x}O$, where M is Mg or Zn, and $0<x<1$,
wherein spin configurations of the p-type semiconductor alloy in the presence of a hole include singly occupied O 2p orbitals and filled Mg 2p or Zn 3d orbitals.

6. The device according to claim 5, wherein $0.2 \leq x \leq 0.3$.

7. The device according to claim 5, wherein x is 0.25.

8. The device according to claim 5, wherein the device further comprises:
an electrolyte;
dye molecules; and
a layer comprising a transparent n-type semiconductor.

9. The device according to claim 8, wherein the transparent n-type semiconductor comprises titanium dioxide.

10. The device according to claim 5, wherein the first layer has a thickness between about 500 nanometers and about 100 micrometers.

11. The device according to claim 5, wherein the device further comprises:
an electron acceptor layer;
an electron donor layer; and
a conducting layer.

12. The device according to claim 11, wherein the electron acceptor layer, the electron donor layer, or both also act as a light absorber.

13. The device according to claim 5, wherein the device further comprises:
at least one layer selected from the group consisting of an electron injection layer (EIL) and a hole injection layer (HIL);
a light absorbing layer; and
a conducting layer.

14. The device according to claim 5, wherein the device further comprises:
an amorphous silicon layer; and
a conducting layer.

15. The device according to claim 5, wherein the first layer is adapted to function as part of a solar cell or a solar energy conversion device.

16. The device according to claim 5, wherein a quasiparticle gap of the p-type semiconductor alloy is between 3.3 and 4.4.

* * * * *